US009826657B2

(12) United States Patent
Killen et al.

(10) Patent No.: US 9,826,657 B2
(45) Date of Patent: Nov. 21, 2017

(54) STORAGE ENCLOSURE CARRIER WHICH SUPPORTS MULTIPLE STORAGE DEVICES

(71) Applicant: Seagate Technology LLC, Cupertino, CA (US)

(72) Inventors: Odie Killen, Colorado Springs, CO (US); Paul Foisy, Dunedin, FL (US); Robert Walker, Clearwater Beach, FL (US); Alexander C. Worrall, Waterlooville (GB); David M. Davis, Portsmouth (GB)

(73) Assignee: Seagate Technology LLC, Cupertino, CA (US)

( * ) Notice: Subject to any disclaimer, the term of this patent is extended or adjusted under 35 U.S.C. 154(b) by 2 days.

(21) Appl. No.: 14/957,231

(22) Filed: Dec. 2, 2015

(65) Prior Publication Data
US 2017/0164501 A1 Jun. 8, 2017

(51) Int. Cl.
*G06F 1/16* (2006.01)
*H05K 5/00* (2006.01)
*H05K 7/00* (2006.01)
*H05K 7/14* (2006.01)

(52) U.S. Cl.
CPC ......... *H05K 7/1489* (2013.01); *H05K 7/1492* (2013.01)

(58) Field of Classification Search
CPC .......... G06F 1/181; G06F 1/186; G06F 1/187; G06F 1/1601; G06F 1/1656; G06F 1/1675; H05K 7/1489; H05K 7/1492; H05K 7/1494; H05K 7/1488; H05K 7/1487; H05K 7/1485

USPC ............. 361/679.31–679.39, 724–727, 760; 312/223.1–223.3
See application file for complete search history.

(56) References Cited

U.S. PATENT DOCUMENTS

| | | | |
|---|---|---|---|
| 5,673,028 A | 9/1997 | Levy | |
| 6,114,866 A | 9/2000 | Matsuo et al. | |
| 6,876,547 B2 | 4/2005 | McAlister | |
| 7,321,312 B1 | 1/2008 | Garnett | |
| 7,983,032 B2 | 7/2011 | Walker et al. | |
| 8,310,836 B2 | 11/2012 | Schuette | |
| 8,508,928 B2 | 8/2013 | Killen et al. | |
| 2003/0136849 A1 | 7/2003 | Adelmann | |
| 2008/0212437 A1 | 9/2008 | Kataoka et al. | |
| 2012/0081856 A1 | 4/2012 | Hopkins et al. | |
| 2012/0147545 A1 | 6/2012 | Niu et al. | |
| 2013/0163183 A1 | 6/2013 | Lin | |
| 2014/0131436 A1 | 5/2014 | Critchley et al. | |

(Continued)

*Primary Examiner* — Anthony Haughton
(74) *Attorney, Agent, or Firm* — Hall Estill Attorneys at Law

(57) ABSTRACT

Method and apparatus for populating and operating a storage enclosure carrier with multiple hot swappable storage devices. In some embodiments, a carrier housing having length, width and thickness dimensions is adapted to accommodate at least one hard disc drive (HDD) having a selected HDD form factor and configured for engagement in a storage enclosure housing. A plurality of solid state drives (SSDs) each conforming to a selected SSD form factor are supported within the length, width and thickness dimensions of the carrier housing. Each of the SSDs is individually retractable from a front facing portion of the carrier housing without removal of the carrier housing from the storage enclosure housing.

20 Claims, 8 Drawing Sheets

(56) References Cited

U.S. PATENT DOCUMENTS

| | | | | |
|---|---|---|---|---|
| 2015/0362965 A1* | 12/2015 | Davis | ............... | G06F 1/187 |
| | | | | 361/679.33 |
| 2016/0128223 A1* | 5/2016 | Fu | ............... | H05K 7/1487 |
| | | | | 361/679.31 |
| 2016/0192532 A1* | 6/2016 | Tseng | ............... | H05K 7/1487 |
| | | | | 361/679.33 |

* cited by examiner

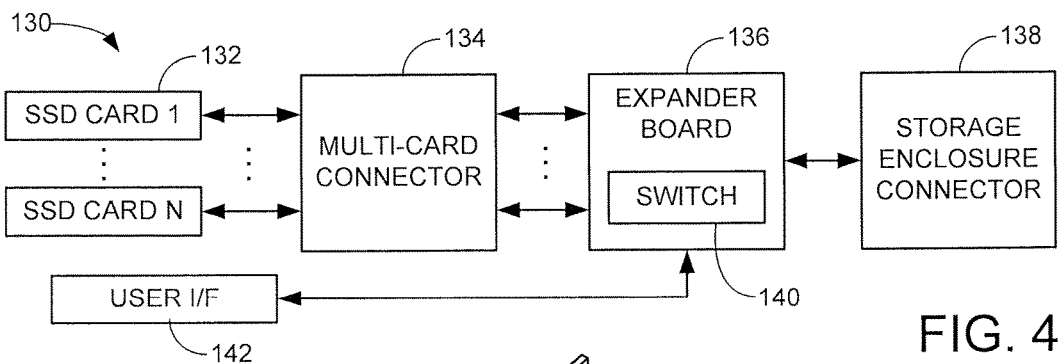
FIG. 4
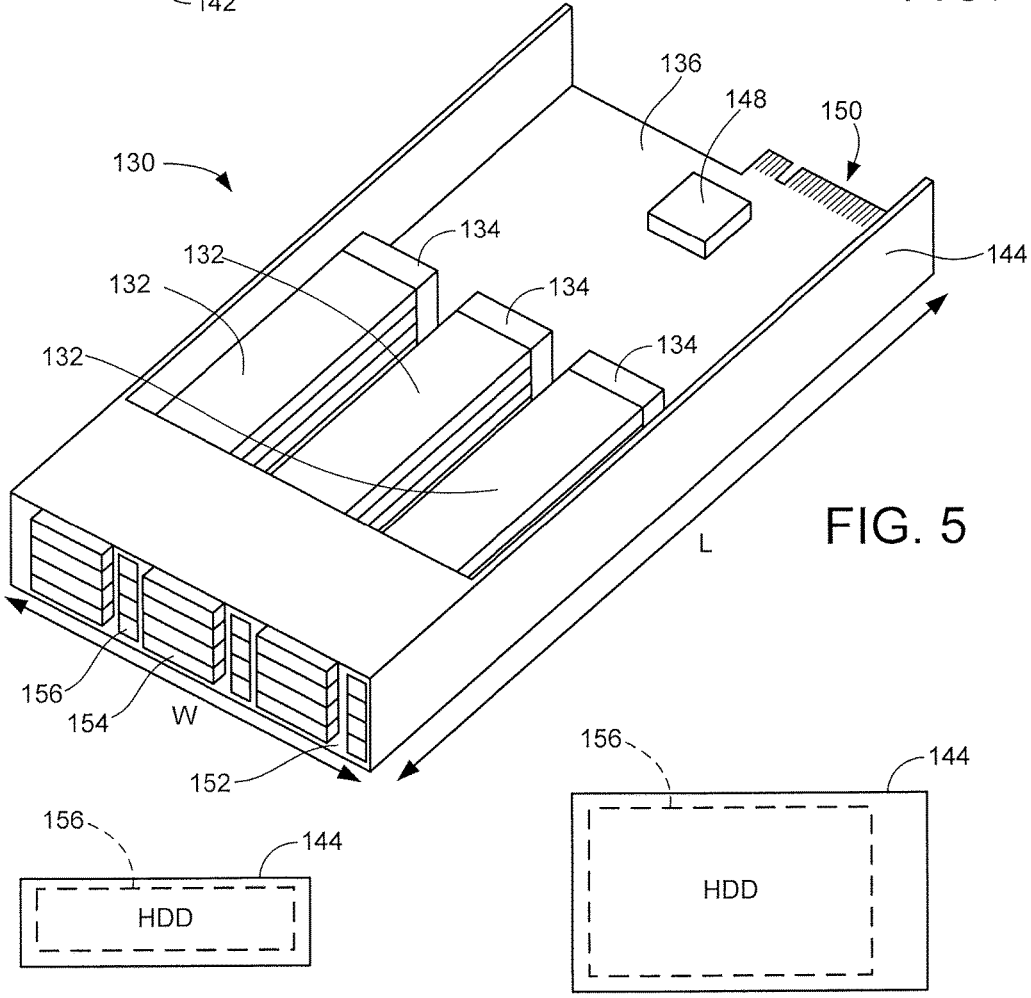
FIG. 5
FIG. 6A
FIG. 6B

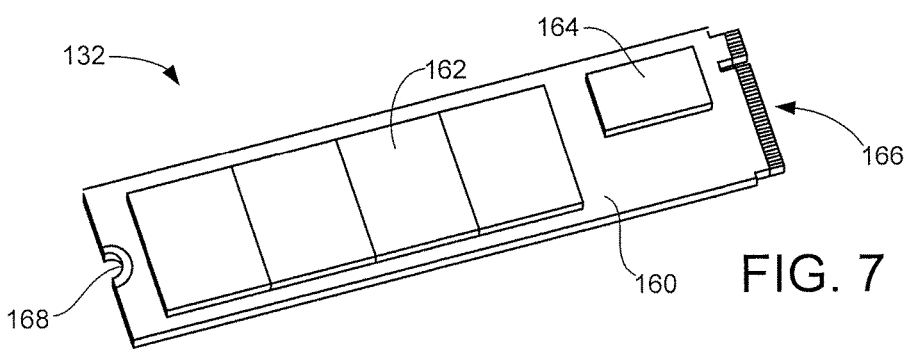
FIG. 7
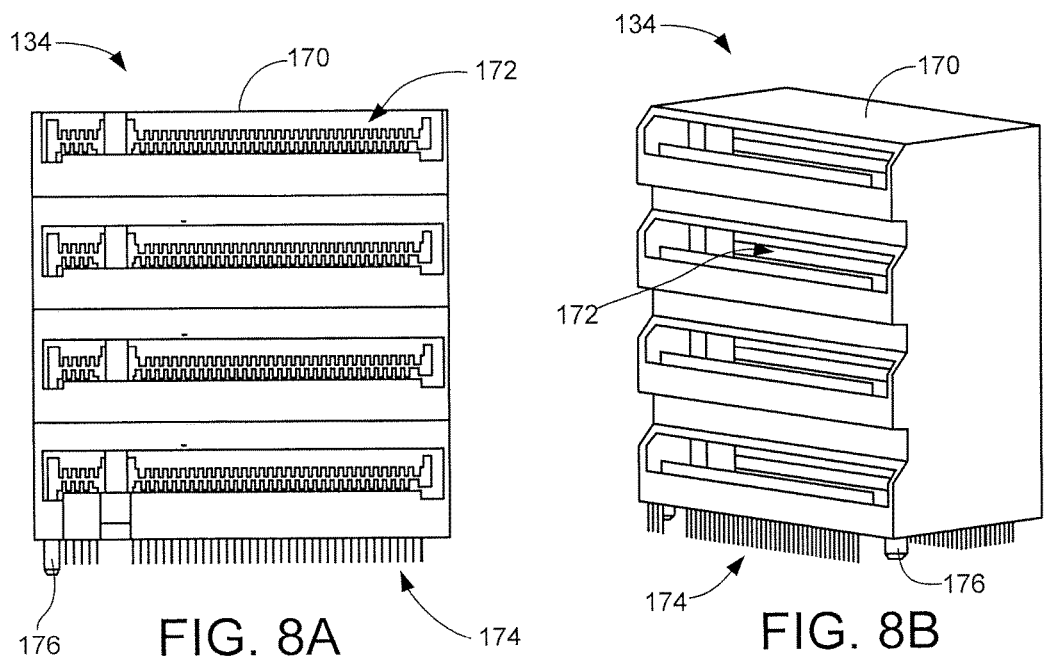
FIG. 8A
FIG. 8B
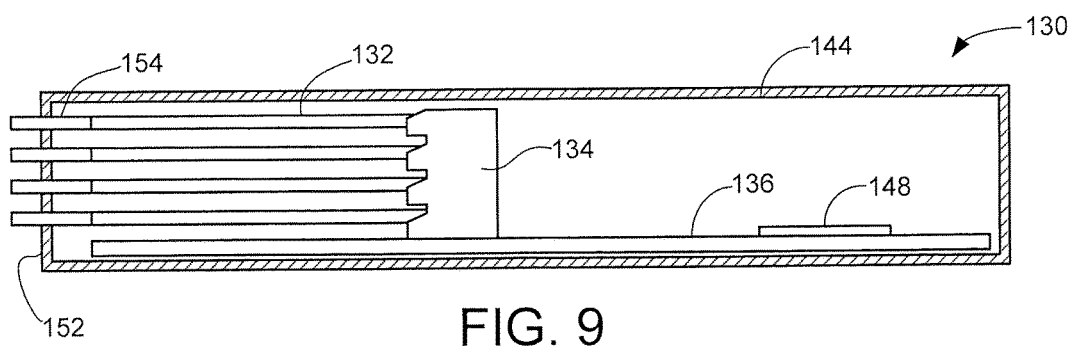
FIG. 9

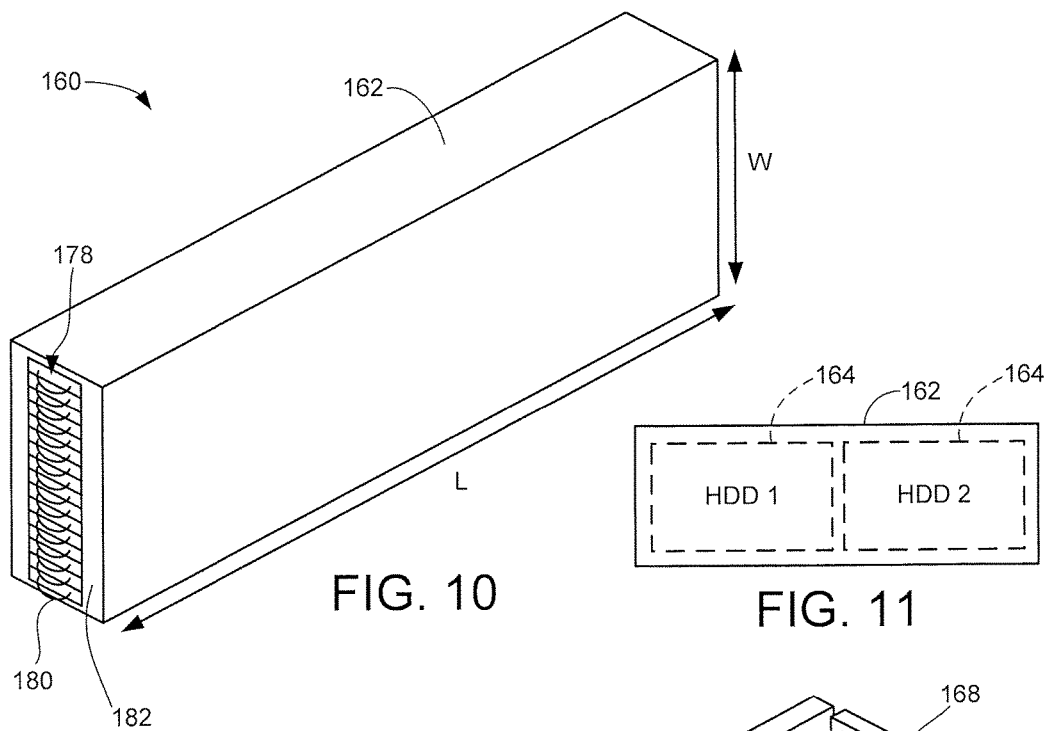
FIG. 10
FIG. 11
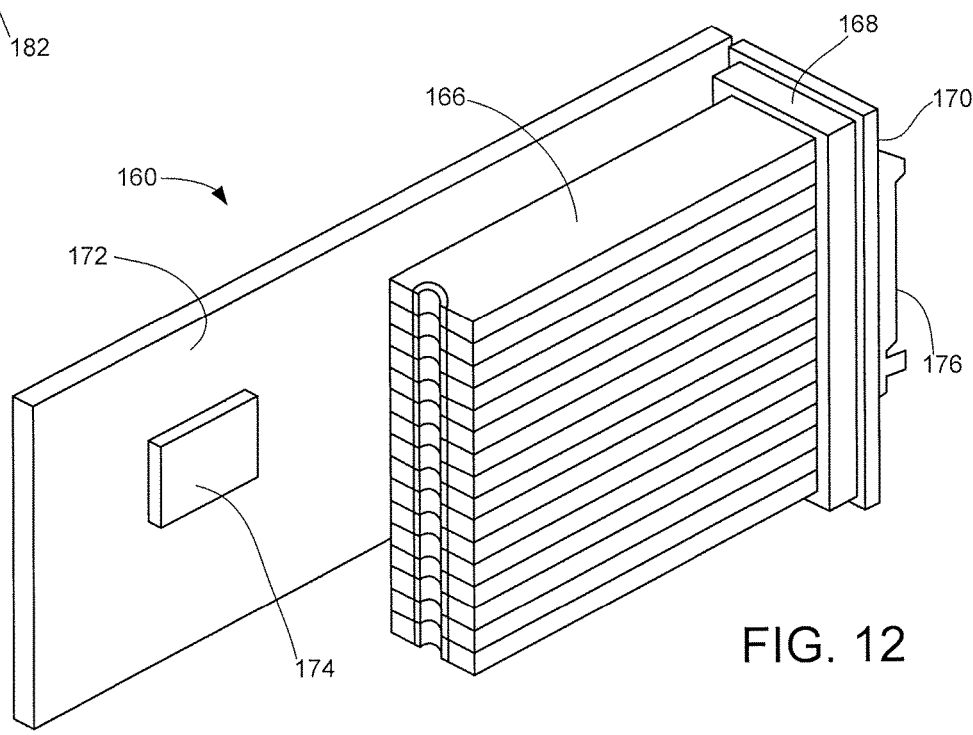
FIG. 12

STORAGE ENCLOSURE CARRIER WHICH SUPPORTS MULTIPLE STORAGE DEVICES

SUMMARY

Various embodiments of the present invention are generally directed to a method and apparatus for populating and operating a storage enclosure carrier with multiple hot swappable storage devices.

In some embodiments, a carrier housing having length, width and thickness dimensions is adapted to accommodate at least one hard disc drive (HDD) having a selected HDD form factor and configured for engagement in a storage enclosure housing. A plurality of solid state drives (SSDs) each conforming to a selected SSD form factor are supported within the length, width and thickness dimensions of the carrier housing. Each of the SSDs is individually retractable from a front facing portion of the carrier housing without removal of the carrier housing from the storage enclosure housing.

In other embodiments, a storage enclosure has a storage enclosure housing with overall length and width dimensions, a front facing surface and a rear facing surface. At least a selected one of a storage enclosure control board supporting a control circuit, a power supply, or a cooling fan is mounted within the storage enclosure housing adjacent the rear facing surface. A plurality of storage enclosure connectors are mounted within the storage enclosure housing at a medial location thereof. A plurality of carrier assemblies is disposed within the storage enclosure housing adjacent to and extending through the front facing surface. Each carrier assembly has a carrier housing sized to accommodate at least one storage device having a 3½ in form factor or a 2½ in form factor, a plurality of solid state drive (SSD) cards each conforming to a selected M.2 SSD form factor, a multi-card connector which receivingly engages the SSD cards and a carrier control board supporting a switching circuit connected to the multi-card connector and a selected one of the storage enclosure connectors. Each of the SSD cards is individually removable and replaceable through an access aperture in a front facing surface of the carrier housing without removal of the carrier housing from the storage enclosure housing.

In still further embodiments, a method includes populating a storage enclosure housing with a storage enclosure control board supporting a control circuit, a power supply, and a cooling fan adjacent a rear facing surface of the storage enclosure housing, and a plurality of storage enclosure connectors adjacent a medial location of the storage enclosure housing; placing a plurality of solid state drive (SSD) cards conforming to a selected M.2 SSD form factor standard into a carrier assembly housing sized to accommodate at least one storage device having a 3½ in form factor or a 2½ in form factor, the plurality of SSD cards contactingly engaging a multi-card connector within the carrier assembly housing along a zero degree insertion path orthogonal to a front facing surface of the carrier assembly housing; and inserting the carrier assembly housing into the storage enclosure housing through a front facing surface of the storage enclosure housing to engage a carrier connector in communication with the multi-card connector with a selected one of the plurality of storage enclosure connectors.

These and other features and advantages of various embodiments can be understood from a review of the following detailed description and the accompanying drawings.

BRIEF DESCRIPTION OF DRAWINGS

FIG. 4 is a functional block representation of a selected carrier assembly from FIG. 3.

FIG. 5 is an isometric depiction of the carrier assembly of FIG. 4 in accordance with some embodiments.

FIGS. 6A-6B show how the carrier assembly housing of FIG. 5 is sized to accommodate a native type of storage device instead of the SSD cards depicted in FIG. 5.

FIG. 7 illustrates a selected one of the SSD cards of FIG. 5 in accordance with a selected M.2 SSD form factor standard.

FIGS. 8A-8B show respective front and isometric views of a selected multi-card connector from FIG. 5.

FIG. 9 is a side elevational schematic depiction of the carrier assembly of FIG. 5.

FIG. 10 is an isometric depiction of another carrier assembly in accordance with further embodiments.

FIG. 11 shows how the carrier assembly housing of FIG. 10 is sized to accommodate multiple native storage devices of a style different than SSD cards.

FIG. 12 shows interior components of the populated carrier assembly of FIG. 10.

DETAILED DESCRIPTION

Figure 1:
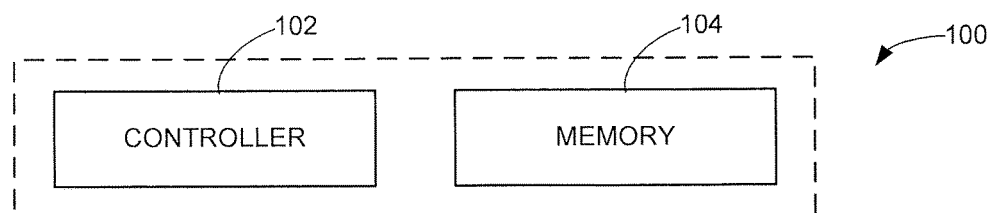
FIG. 1 provides a functional block diagram of a data storage device constructed in accordance with various embodiments of the present disclosure.

Various embodiments of the present disclosure are generally directed to data storage systems, and more particularly, to a carrier in a storage enclosure configured to house multiple data storage devices.

Large-scale data storage systems generally comprise storage devices such as hard disc drives (HDDs) and solid-state drives (SSDs). HDDs generally use rotatable data recording media, such as magnetic recording discs, to store data. SSDs use solid-state semiconductor memory, such as flash memory cells, to store data.

The storage devices may be held in carriers which are inserted into slots in multi-device storage enclosures. The enclosures, in turn, may be mounted into racks or cabinets to provide high density data storage systems, such as but not limited to a distributed object, cloud storage environment. Each enclosure may include a number of other active components to support the operation of the storage devices such as controllers, thermal cooling mechanisms, power supply units, etc.

HDDs are usually provided in industry standard sizes such as the well known 3½ inch (in.) form factor and the 2½ in. form factor. The 3½ in form factor has nominal length and width dimensions of 146.1 mm by 101 mm. The 2½ in form factor has nominal length and width dimensions of 101 mm by 73 mm. Generally, two 2½ in form factor drives placed side-by-side will have the same overall footprint as a 3½ in form factor drive. This industry standardization promotes certain efficiencies in the manufacture of mass storage systems. These industry standard sizes are defined including by the Small Form Factor Committee, with standard SFF-8301 defining basic dimensions for the 3½ in FF and standard SFF-8201 defining basic dimensions for the 2½ in FF.

Another commonly employed industry standard size for SSDs is referred to as the M.2 standard (or more generally, the PCI-SIG PCI Express M.2 Specification). Formerly referred to as the Next Generation Form Factor (NGFF), the M.2 standard provides a substantially rectangular printed circuit board to which various memory and control integrated circuit devices are mounted. The board has an edge connector along one side with up to 67 pins and a semicircular mounting hole at the center of the opposite edge. The M.2 standard defines board widths of 12, 16, 22 and 30 mm, and board lengths of 16, 26, 30, 38, 42, 60, 80 and 110 mm. A commonly employed size is the M.2 2242, which is an SSD having dimensions of nominally 22 mm by 42 mm. Another commonly employed size is the M.2 2280, with dimensions of nominally 22 mm by 80 mm.

As industry demand continues to drive a need for storage systems with ever higher levels of data storage capacity and performance, there exists a continual need for improvements in the manner in which storage devices, such as SSDs and HDDs, may be efficiently integrated into a storage enclosure.

Various embodiments of the present disclosure are accordingly directed to an apparatus and associated method for a carrier assembly in a storage enclosure configured to house multiple data storage devices. As explained below, some embodiments provide a carrier housing sized to house at least one data storage device of a first type and having a first overall form factor. The carrier is populated with multiple data storage devices of a different, second type that fit within the first overall form factor of the first type of storage device.

In some embodiments, carrier housings are provided for large form factor (e.g., 3½ in FF HDDs) or small form factor (e.g., 2½ in FF HDDs) storage devices. The carrier housing may be sized to house a single HDD or multiple HDDs. SSD modules conforming to the M.2 standard are fixably mounted within the carriers. A switch on a control board within the carrier connects multiple SAS or PCIe based SSD modules to a midplane or other storage enclosure connection point intended to normally support a single SAS or PCIe connection. Each SSD module may be hot swappable. A tactile switch can be used to signal the intention to hot swap a particular SSD module.

Some embodiments use a SAS, Ethernet or PCIe based switch circuit to provide fan out to multiple SSD modules from a single connector. In some cases, up to 16 M.2 SSD modules may be placed in a single drive carrier. The SSD modules may be removed from a front facing surface of the carrier without the need to remove the carrier from the storage enclosure housing.

Internal connectors may be used to support the close packing of the SSD modules. The connectors may be oriented to support direct line plugging (0 degrees offset) of the SSD modules (cards). SSD carriers may be affixed to the ends of the SSD cards and project out the front surface of the storage enclosure to enhance the ability of a user to insert and remove the SSD cards from the carrier housing. Carriers sized to house multiple HDDs may be configured to provide a corresponding number of connectors to mate with the storage enclosure with one connector per HDD. For example, a double slot carrier for two HDDs would have two connection points, a triple slot carrier for three HDDs would have three connection points, and so on. In such cases, the same number of connectors can be provided to multiplex among multiple internal SSD cards within the carrier.

These and other features and advantages of various embodiments can be understood beginning with a review of FIG. 1 which provides a functional block representation of a data storage device 100 in accordance with some embodiments.

The data storage device 100 includes a top level controller 102 and a memory module 104. The controller 102 can take the form of a hardware or programmable processor with associated programming in memory to provide top level control of the device 100. The memory module 104 provides non-volatile memory storage of data supplied by a host device such as a personal computer, tablet or other electronic device.

The memory module includes storage memory such as in the form of rotatable magnetic recording discs or solid state memory, such as but not limited to NAND flash memory. The storage device 100 also includes support circuitry and components as required to facilitate the transfer of data to the memory, including read/write channel circuitry, data buffers, on-the-fly ECC (error correction code) processing circuitry, encryption circuitry, etc. In some cases, the controller functionality may be incorporated directly into the memory module.

Figure 2:
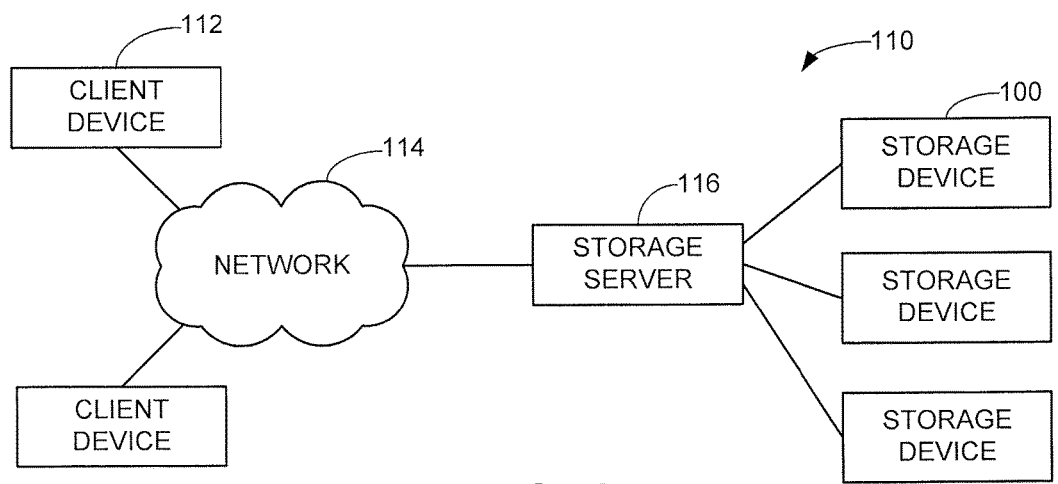
FIG. 2 depicts an exemplary distributed storage network in accordance with some embodiments.

FIG. 2 shows a diagram for a storage system 110 that incorporates storage devices such as 100 in FIG. 1. Other system configurations can be used, so the arrangement of FIG. 2 is merely exemplary and is not limiting. Client devices 112 are accessed by local users. The client devices 112 communicate via a network 114 to a remote storage server 116, which in turn directs access commands from the client devices 112 to various storage devices 100.

Figure 3:
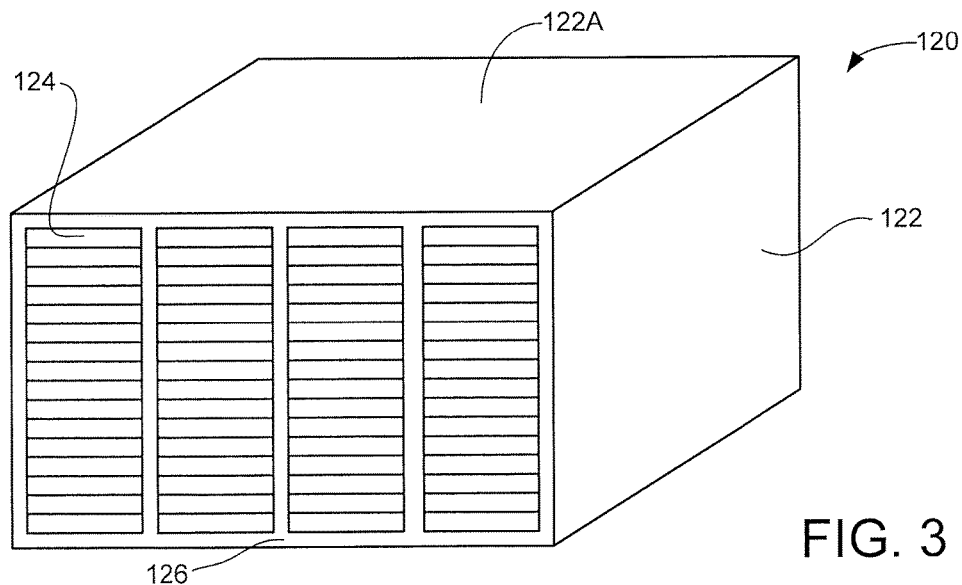
FIG. 3 depicts a storage enclosure in accordance with some embodiments.

The storage devices may be arranged in one or more storage enclosures 120, such as depicted in FIG. 3. The storage enclosure 120 provides a rigid storage enclosure housing 122 into which carrier assemblies 124 are inserted through a front facing surface 126 of the storage enclosure housing. Each carrier assembly 124 has a housing sized to accommodate one or more storage devices of a selected type. In one embodiment, the carrier assemblies 124 are sized to each accommodate a single 3½ in form factor HDD. Alternatively, the carrier assemblies are sized to each accommodate a single 2½ in form factor HDD. In still other embodiments, each carrier assembly is sized to accommodate multiple storage devices of various respective form factors, including multiple 3½ in form factor HDDs or multiple 2½ in form factor HDDs.

In accordance with various embodiments, at least some of the carrier assemblies 124 are not populated with the one or more type of native storage devices (e.g., HDDs), but instead are populated with multiple storage devices of a different, second type. The present discussion will use 3½ in form factor storage devices as an exemplary first type of storage device, and M.2 standard SSD modules as an exemplary second type of storage device. This is merely for purposes of providing a concrete example and is not limiting.

It will be appreciated that in some embodiments, some of the carrier assemblies 124 in the storage enclosure 120 of FIG. 3 house HDDs and other carrier assemblies house multiple SSDs. This facilitates a hot storage zone formed by the SSDs into which hotter, more relevant data can be migrated to support faster I/O transfer rates, and a cold storage zone formed by the HDDs into which colder, less relevant data are stored to support a relatively slower I/O transfer rate. In other embodiments, all of the carrier assemblies 124 in FIG. 3 house multiple SSDs to support high speed I/O transfer rates as discussed below. This allows carrier housings of a standard size to support multiple different types of storage devices in the same storage enclosure without requiring changes to the remaining configuration of the storage enclosure.

FIG. 4 is a functional block diagram of a carrier assembly 130 constructed and operated in accordance with some embodiments. The carrier assembly 130 is sized for mating engagement with a selected slot or slots of the storage enclosure housing 122 of FIG. 3. The carrier assembly 130 includes a plural number N SSD cards (modules) 132. In some embodiments, N is set equal to 12 (N=12). In other embodiments, N is set equal to 16 (N=16). In still further embodiments, N is set to some other plural number. It will be appreciated that the maximum value of N will depend on the available space within the volumetric extent of the housing of the carrier assembly 130, as well as the form factor(s) and placement of the individual SSD cards 132.

The SSD cards 132 take a selected form factor (or multiple different form factors), such as but not limited to the M.2 standard with selected width and length dimensions. Each SSD card utilizes semiconductor non-volatile memory, such as one or more NAND flash memory devices. The use of NAND flash memory is merely for purposes of discussion and is not limiting, as any form of semiconductor non-volatile memory can be used including other forms of flash memory (including NOR flash), RRAM (resistive random access memory), MRAM (magnetic random access memory), STRAM (spin-torque transfer random access memory), PCRAM (phase change random access memory), etc. Two dimensional (2D) and three dimensional (3D) memory arrays are contemplated.

The SSD cards 132 are interconnected with one or more multi-card connectors 134. As explained below, the connector(s) 134 take an orientation such that the SSD cards 132 can be inserted into a front surface of the carrier assembly 130 in an orientation along an insertion path that is parallel to a length (insertion) direction of the carrier assembly 130. This orientation is referred to as a zero (0) degree insertion angle. This insertion angle allows the SSD cards 132 to remain accessible to a user without the need to remove the carrier assembly 130 from the housing. In another embodiment, single-way connectors can be used with multiple-stacked PCBs to provide further stacking options.

The carrier assembly 130 further includes an expander board 136 (herein more generally referred to as a "control circuit" or "control circuit board"). The expander board supports the connector(s) 134 and provides electrical interconnection with a storage enclosure connector 138, such as a midplane connector on a midplane board within the storage enclosure. The expander board 136 supports various circuits to facilitate operation of the SSD cards 132, including a switching circuit (switch) 140 that directs access commands and data flow between the respective SSD cards 132 and the storage enclosure connector 138. In alternative embodiments, the connectors 134 and board 136 can be transposed, so that a multi-card connector board could be provided to be plugged into the storage enclosure midplane and have both the expander board and the SSD cards plugged into it. This leads to another variant of FIG. 17 (discussed below) where the PCB connects directly into the midplane and the expander board connects into the PCB rather than into the midplane. This latter embodiment may be useful when using more than one midplane connector per carrier.

For storage enclosures configured to support one storage device (e.g., HDD) per enclosure, data exchanges can be multiplexed through the single connection provided by the storage enclosure connector 138 for the multiple N SSD cards 132. While this may provide a single connector, this may provide operative connection to two controllers, providing dual path redundancy to each of the storage devices. With reference again to FIG. 2, this could provide two storage servers 116 each with a connection to each storage device 100.

The SSD cards 132 can be individually addressed or treated as a single "combined" storage device, with control circuitry on the expander board 136 managing the storage of the data among the various available SSD cards. Distributed storage processing such as the use of RAID (redundant array of independent discs) can be applied across the SSD cards 132 as desired. Such processing can be among the SSD cards within a single carrier assembly 130 or across SSD cards in multiple carrier assemblies.

A user interface for the carrier assembly 130 is depicted at 142. The user interface can take a variety of forms depending on the requirements of a given application. In some embodiments, the user interface 142 includes operational indication devices such as LEDs or other human detectable devices to signify status information to a user. In further embodiments, the user interface 142 may include one or more optional tactile switches that, when depressed by a user, facilitates a hot swap operation in which a selected SSD card is removed and replaced within the carrier assembly 130. The switch may include feedback mechanisms, including the ability to vibrate or provide a visual indication to the user indicating that it is safe to remove the associated SSD card 132. A hot swapping operation allows the carrier assembly 130 to remain plugged into the storage enclosure 120 in an operational condition while one or more of the SSD cards are replaced. In this way, ongoing data transfer operations can be carried out during the replacement operation.

FIG. 5 shows a simplified, isometric depiction of the carrier assembly 130 of FIG. 4 in accordance with some embodiments. Other configurations can be used so FIG. 5 is merely exemplary and is not limiting. A total of twelve (12) SSD cards 132 are shown to be supported within a carrier housing 144, with each of the SSD cards being accessible from a front facing surface 146 of the carrier housing. A total of three (3) multi-card connectors 134 interconnect sets of four (4) SSD cards 132 to the expander board 136. Other respective numbers of SSD cards and connectors can be used as required, including but not limited to single connectors on a mini-PCB with board-to-board (B2B) stacking PCB connectors. The SSD cards 132 may be contactingly adjacent as generally depicted in FIG. 5, or there may be a small intervening space between each adjacent pair of the cards as required. Integrated circuits will be disposed on each card, but such have been omitted from FIG. 5 for simplicity of illustration.

The expander board 136 supports control circuitry such as represented by integrated circuit (IC) device 148. Only one such IC device is shown, but in practice multiple such IC devices may be provided, including switching circuits, memory circuits, multiplexors, encoding circuits, etc. An expander board connector 150 interfaces with the storage enclosure connector 138 of FIG. 4 when the carrier assembly 130 is plugged into the storage enclosure 120 (FIG. 3).

The SSD cards 132 are accessible through a front facing surface 152 of the storage enclosure housing 144. The distal ends of the SSD cards 132 may project through this surface so that a user may directly grasp a selected SSD card during insertion and retraction operations. In other embodiments, an SSD carrier (adapter) 154 is attached to the end of each SSD card 132. The SSD carriers provide a convenient mechanism to facilitate manipulation of an associated SSD card without the need to directly contact the SSD card, thereby reducing a risk of electrostatic discharge (ESD) or other damage to the SSD card by the user. The SSD carriers also allow the SSD cards to be located deeper within the interior of the carrier housing 144. In at least some cases, the SSD carriers may also provide EMI shielding functions by contacts between each of the SSD cards and the carrier housing to reduce electromagnetic emissions from the module.

User depressible switches are depicted at 156. These switches form a portion of the user interface 142 in FIG. 4, and may be used, for example, to signal an intention to perform a hot swap operation in which a selected SSD card 132 (and the associated SSD carrier 154) are about to removed while the system remains in a powered up, operational state.

The carrier housing 144 has overall length and width dimensions as indicated by arrows L and W. While not necessarily required, it is contemplated that the carrier housing 144 may be sized to accommodate a single native hard disc drive HDD 156, as depicted in FIGS. 6A and 6B. FIG. 6A represents a front facing view of the carrier housing 144, and FIG. 6B is a top plan view representation of the carrier housing.

Multiple SSD cards 132 can be easily enclosed within the volumetric space that would otherwise be occupied by the HDD 156. The HDD 156 is contemplated as having a 3½ in form factor size with overall length, width and height dimensions of nominally about 147 mm by 101 mm by 26.1 mm, and the SSD cards 132 easily fit within these dimensions. The outermost dimensions of the carrier assembly housing 144 can vary, and may be on the order of about 160 mm in length (L) and about 110 mm in width (W). Other sizes can be used as desired, including a carrier sized to accommodate a 2½ in form factor HDD.

FIG. 7 shows a selected one of the SSD cards 132 in greater detail. Other sizes, form factors and configurations can be used as desired. The exemplary SSD card 132 in FIG. 7 includes a substrate printed circuit board 160 on which is mounted a number of flash memory devices 162. One or more controller circuit IC devices denoted at 164 may be additionally provided to provide local SSD control circuit functionality for the SSD card.

The SSD card 132 includes an edge connector 166 configured for mating engagement with an associated SSD card connector 134 (see FIG. 5). A semi-circular mounting recess 168 is disposed opposite the edge connector 166. It is contemplated that the SSD card 132 in FIG. 7 complies with the M.2 standard, such as but not limited to a 2280 M.2 card with nominal dimensions of 22 mm by 80 mm.

FIGS. 8A and 8B provide front and isometric representations of a selected multi-card connector 134 of the carrier assembly 130 of FIG. 5 in accordance with some embodiments. Other configurations for the connectors can be used. It will be recalled from FIG. 5 that the connector 134 is mounted to the expander board 136 and supports the interconnection of multiple SSD cards 132 (in this case, four (4) cards each). A total of three (3) such connectors 134 are used to support the twelve (12) SSD cards 132 shown in FIG. 5.

The connector 134 includes a connector body 170 formed of a suitable rigid material such as injection molded plastic. Card connection slots 172 accommodate insertion of, and electrical interconnection with, the respective SSD cards 132. Each slot 172 has an associated set of internal electrically conductive paths that terminate in connection pins 174 that insert into the expander board 136. Four (4) parallel sets of the connection pins extend from the bottom surface of the connector 134. In this way, access commands and data transfers can be separately directed to each slot 172, and from there to each SSD card 132, in turn. Alignment features 176 facilitate alignment of the connector 134 with the expander board 136 during manufacturing attachment of the connector 132 to the expander board 136. The connector 134 may be connected using any suitable manufacturing process such as a solder reflow operation. As before, this is merely illustrative and not limiting. In other embodiments, multiple single-way connectors stacked by use of multiple PCB and standard B2B connectors could be utilized as desired.

FIG. 9 is a simplified, side-elevational depiction of the carrier assembly 130 of FIG. 5 using the SSD cards 132 of FIG. 7 and the connectors 134 of FIGS. 8A-8B. It can be seen that the example configuration of FIG. 9 places the connectors 134 in an intermediate location within the carrier housing 144 along the expander board 136. The aforementioned SSD carriers (adapters) are generally denoted at 154 and extend through the front facing surface 152 of the carrier housing 144. A single large slot may be provided to accommodate the stack of SSD cards 132 and individual SSD carriers 154, or individual slots may be provided as generally represented in FIG. 9. The SSD carriers 154 can use any suitable attachment mechanism to attach to the ends of the respective SSD cards 132, including threaded fasteners, clips, rails, etc. The SSD carriers can further be provided with spacing features to maintain a desired inter-card spacing at a distal end of the SSD cards.

When used, the overall length of the SSD carriers 154 will depend on a variety of factors including the relative location of the connectors 134 within the carrier housing 144 (e.g., how close to the front of the carrier housing the connectors are located), the overall length of the individual SSD cards 132, the overall dimensions of the carrier housing 144, etc. Regardless, it is contemplated that the SSD cards, either directly or via the SSD carriers 154, will be accessible for individual removal from the front facing surface 152 of the carrier housing 144 without the need to remove the carrier assembly 130 from the storage enclosure. The SSD carriers 154 further provide a convenient mechanism to facilitate insertion of a replacement SSD card 132 into the connector 134 by the user.

FIG. 10 shows another carrier assembly 160 constructed in accordance with various embodiments. The carrier assembly 160 is sized for insertion into a storage enclosure such as the storage enclosure 120 of FIG. 3. The carrier assembly 160 may be mounted in a substantially vertical orientation as depicted in FIG. 10, or may be rotated 90 degrees and mounted in a substantially horizontal orientation similar to the carrier assembly 130 shown in FIG. 5. As used herein, the term "horizontal" will be understood as an orientation such that the overall length and width dimensions L and W are parallel with a top facing surface 122A of the storage enclosure 120 (see FIG. 3). The term "vertical" will be orthogonal to this orientation, as depicted in FIG. 10.

The carrier assembly 160 includes a carrier housing 162 sized with length (L) and width (W) dimensions to accommodate two or more HDDs 164, such as depicted in FIG. 11. It is contemplated that the two HDDs (denoted as HDD 1 and HDD 2) are 3½ in form factor drives, but such is merely exemplary and is not limiting. In other embodiments, multi-HDD carriers can be used that place the HDDs in other configurations such as a stacked configuration so that HDD 2 is over HDD 1 with the carrier housing in a horizontal orientation. For example, another embodiment can use a multi-drive carrier sized to house two stacked 2½ in FF drives with a height of about 33 mm, a width of about 80 mm and a length dimension L nominally the same as shown in FIG. 5.

FIG. 12 shows components that may be disposed within the carrier housing 160 of FIG. 10 in some embodiments. A total of sixteen (16) SSD cards 166 are shown to be arranged in a closely spaced, axial stacked relationship. The SSD cards 166 may be similar to the SSD cards 132 discussed above, and are inserted into a multi-card connector 168. The SSD cards 166 may be contactingly adjacent as generally depicted in FIG. 12, or there may be a small intervening space between each adjacent pair of the cards as required. Integrated circuits will be disposed on each card, but such have been omitted from FIG. 12 for simplicity of illustration.

The connector 168 is mounted to a connector board 170 which in turn interconnects with an expander board 172. The expander board 172 is similar to the board 136 discussed above and includes control circuitry including one or more control integrated circuit (IC) devices 174 to control data access exchanges with memory devices on the SSD cards. The expander board 172 communicates with a midplane or other internal connection point within the storage enclosure 120 (FIG. 2), either directly or through an I/O connector 176 located on the connector board 170.

Figure 13:
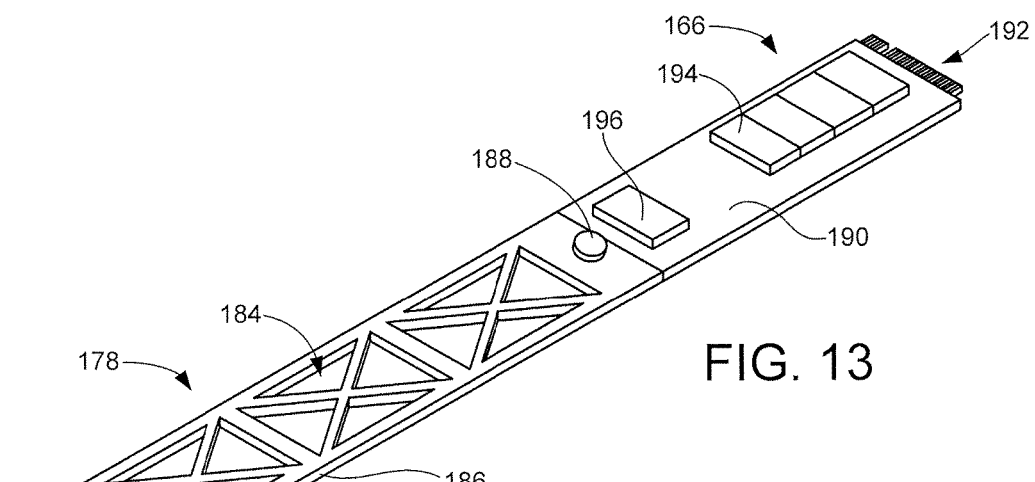
FIG. 13 depicts an SSD card and SSD carrier in accordance with some embodiments.

FIG. 13 shows an SSD carrier 178 attached to a selected one of the SSD cards 166 of FIG. 12. The SSD carrier 178 may be formed of injection molded plastic or other suitable material with sufficient rigidity to enable a user to retract and insert the SSD card into the connector 168. A rotatable D-ring 180 is affixed to the front of the SSD carrier 178 to facilitate grasping of the carrier by the user. The distal ends of the D-rings 180 extend through a front facing surface 182 of the carrier assembly 160, as depicted in FIG. 10.

As desired, cutout apertures 184 can be formed in the body of the SSD carrier 178 to remove weight and enhance cooling airflow through the carrier assembly 160, providing the SSD carrier 178 with a series of strengthening rails 186. A threaded fastener 188 can be used to facilitate attachment of the SSD carrier 178 to the SSD card 166. Other attachment mechanisms can be used as desired.

The SSD card 166 is similar to the SSD card 132 in FIG. 7 and can include a printed circuit board substrate 190 which supports an edge connector 192 at one end, a number of flash memory IC devices 194 and one or more control IC devices 196.

Figure 14:
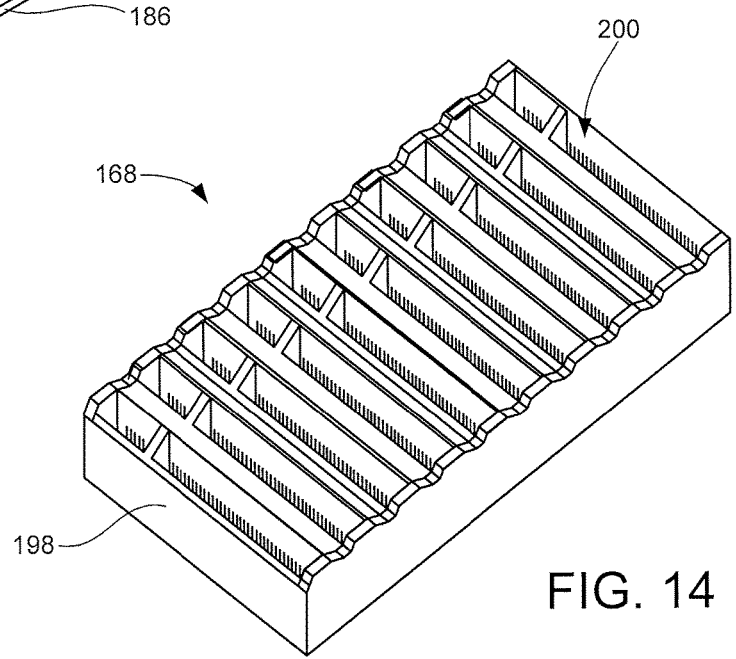
FIG. 14 shows a multi-card connector suitable for use in the carrier assembly of FIG. 10.

An isometric depiction of the multi-card connector 168 is provided in FIG. 14 in accordance with some embodiments. The connector includes a rigid body 198 formed of a suitable rigid material such as injection molded plastic The body 198 provides a number of connection slots 200 to facilitate insertion of the respective SSD cards 166.

It will be noted that a total of sixteen (16) SSD cards 166 are depicted in FIG. 12, but only ten (10) slots are shown in the connector 168 in FIG. 14. This is intentional to indicate that the connector 168 can be configured to support any multiple number of SSD cards as required. The connector configuration of FIG. 14 can be readily extended to support any desired multiple number of SSD cards, including but not limited to sixteen (16) cards. In other embodiments, multiple connectors having a configuration similar to that shown in FIG. 14 can be aligned on the connector board 170 (see FIG. 12). For example, to support N total SSD cards, two connectors each having N/2 slots can be vertically aligned on the connector board 170. Depending upon space constraints, the connectors may be arranged in any suitable adjacent orientation to accommodate the desired stacking of SSD cards.

Figure 15:
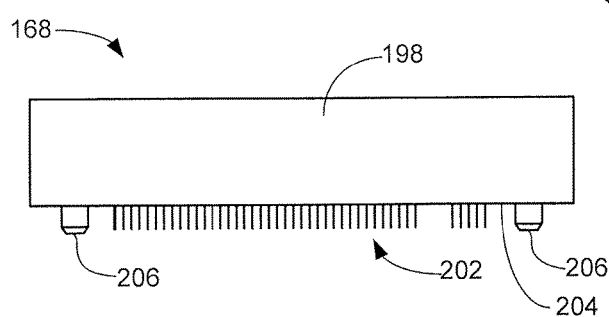
FIG. 15 is a top plan view of the multi-card connector of FIG. 14.

FIG. 15 shows a top plan view of the connector 168 of FIG. 14. Electrically conductive connection pins 202 project from a back surface 204 of the connector 168. A separate row of pins 202 is provided for each slot 200. Alignment features 206 facilitate alignment of the connector 168 with the connector board 170 during manufacturing. As before, the connector 168 can be attached to the connector board 170 using any suitable manufacturing process such as solder reflow.

Figure 16:
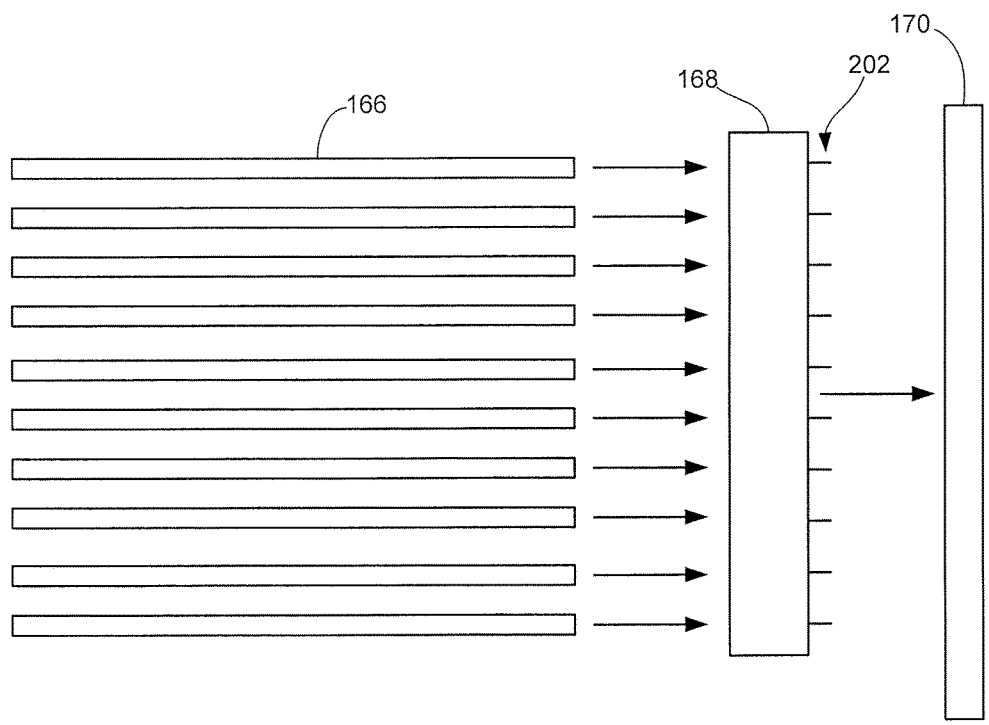
FIG. 16 is a schematic depiction of an insertion sequence for the carrier assembly of FIG. 10.

FIG. 16 is a simplified exploded schematic representation of an insertion sequence for the SSD cards 166 into the connector 168, and the attachment of the connector 168 to the connector board 170. As before, the SSD cards 166 may be configured to be individually retracted and inserted into the individual card slots 200 (FIG. 14) by a user by way of the SSD carriers 178 (FIG. 13). Switching circuitry as discussed above in FIG. 4, including PCIe or SAS switching circuitry, can be disposed on the expander board 172 or the connector board 170 to facilitate the flow of data to the individual SSD cards 166.

In cases where the carrier assembly 160 is configured to house two native storage devices of a first type (e.g., HDD1 and HDD2 in FIG. 11), two interface connectors may be provisioned on the connector board 170 or the expander board 172, and data access commands to a first portion of the SSD cards 166 may be passed through the first connector and data access commands to a second portion of the SSD cards 166 may be passed through the second connector.

In some cases, the number of SSD cards supported by each host (midplane) connector may be the same. In other cases, a first smaller number of SSD cards (e.g., four (4) SSD cards) may be used as a storage space to accommodate access commands associated with a first midplane connection and a second larger number of SSD cards (e.g., twelve (12) SSD cards) may be used as a storage space to accommodate access commands associated with a second midplane connection. In further embodiments, as discussed above each midplane connector may provide two ports, one to each of two separate controllers, and sections of the memory in the SSD cards may be separately addressed by these separate controllers.

Figure 17:
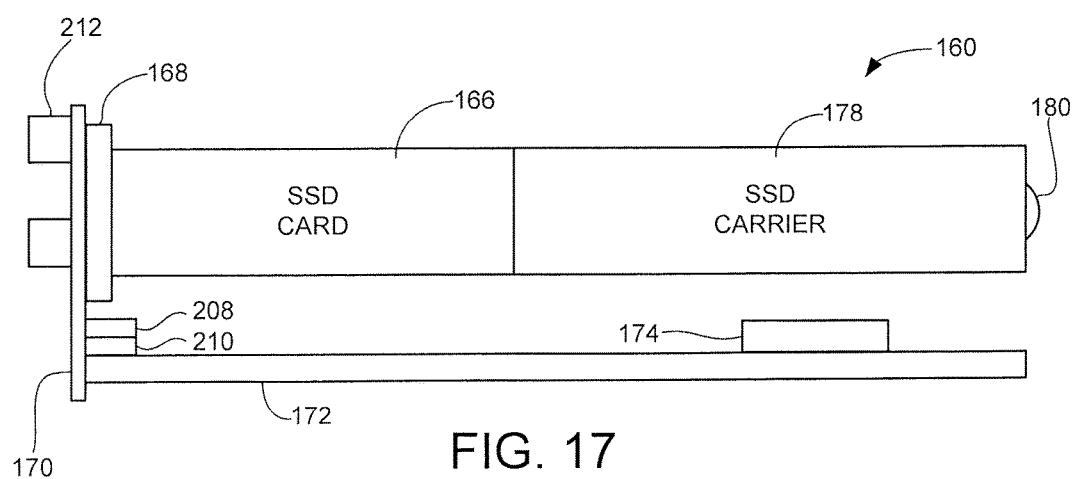
FIG. 17 is a top plan view of the arrangement of FIG. 12.

FIG. 17 is a top plan schematic view of the arrangement of FIG. 12 with the SSD carriers 178 of FIG. 13. The SSD cards 166 are plugged into the connector 168 of FIGS. 14-15 by way of the SSD carriers 178 of FIG. 13. The connector 168 is electrically and mechanically affixed to the connector printed circuit board 170, which in turn is connected via connector 208 of the connector printed circuit board 170 to connector 210 of the expander board 172. This interconnection supports the total number N SSD cards 166 that can be plugged into (via the connector(s) 168) the connector board 170. One or more connectors 212 of the expander board 172 in turn connect to the midplane connector (such as 138, FIG. 4) of the storage enclosure 120. As discussed above, PCIe or SAS switching circuitry can facilitate individual addressing of the SSD cards 166 through the one or more connections provided by the connector(s) 212. As noted previously, the board 170 can instead be used to connect to the midplane, with the expander board 172 connecting into the connector PCB.

Figure 18:
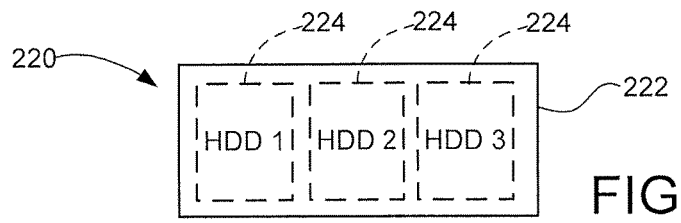
FIG. 18 depicts yet another carrier assembly in accordance with further embodiments, with FIG. 18 showing a housing of the carrier assembly adapted to support three native data storage devices.

FIG. 18 shows another carrier assembly 220 in accordance with some embodiments. The carrier assembly 220 has a rectilinear carrier housing 222 sized to fit within the storage enclosure 120 of FIG. 2. The carrier housing 222 accommodates three (3) 2½ inch form factor HDDs 224 (HDD 1-3) and has three corresponding PCIe, Ethernet or SAS interconnections with the associated midplane or other storage enclosure internal connector (see e.g., 138 in FIG. 4). Other interconnection architectures can be used as desired so that these are merely exemplary and are not limiting.

Figure 19:
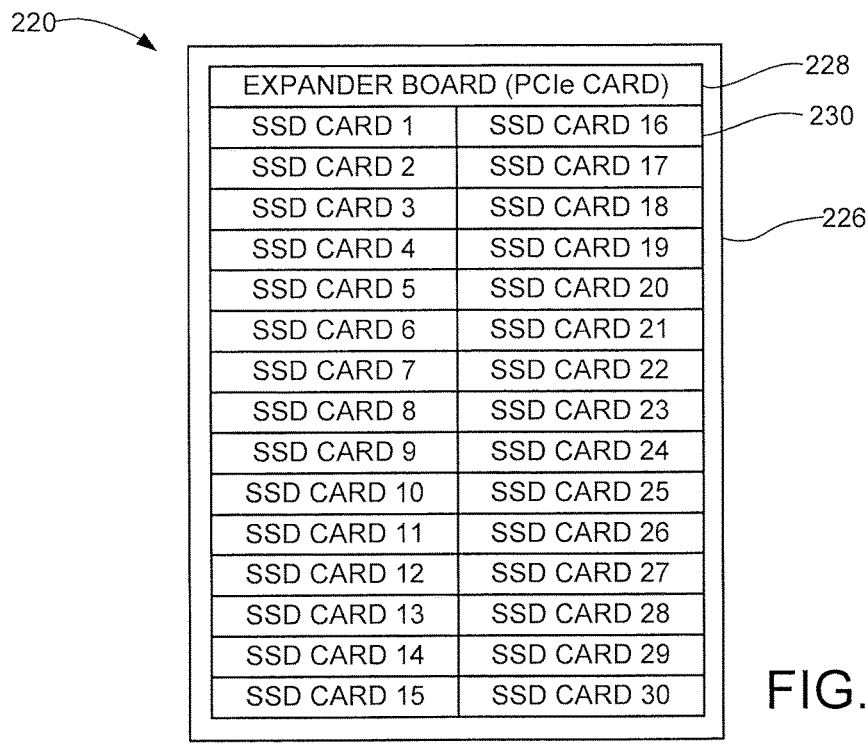
FIG. 19 is a schematic representation of multiple adjacent columns of SSD cards and an expander board plugged into a multi-card connector of the carrier assembly of FIG. 18.

The carrier assembly 220 utilizes a multi-card connector 226, as schematically depicted in FIG. 19. The connector 226 is similar to the connectors 134, 168 discussed above except that the connector 226 further includes the capability to support mating engagement of one or more expander boards (e.g., PCIe cards) 228 in addition to a population of SSD cards 230. In FIG. 19, a total of thirty (30) SSD cards 230 are plugged into the connector 226 as well as a double-wide expander board 228. Other respective numbers of SSD cards and expander boards can be plugged into the connector as required.

Figure 20:
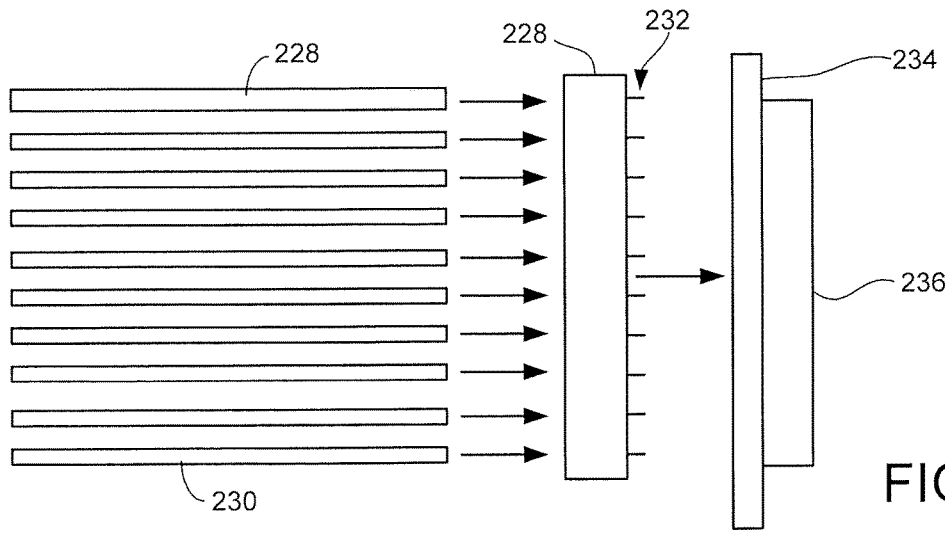
FIG. 20 is a schematic depiction of an insertion sequence for the carrier assembly of FIG. 18.

Other features discussed above can be provided as well, including but not limited to SSD carriers such as 152, 178 to facilitate hot swapping from a front facing surface of the carrier housing 222. A similar expander board carrier can also be attached to the expander board to facilitate hot swapping of the expander board. FIG. 20 shows an elevational schematic depiction of insertion of the expander board 228 and a number of SSD cards 230 into the connector 226 of FIG. 19. The connector 226 may in turn be mounted via connection pins 232 for each connection slot) to a connector board 234. The connector board 234 can include multiple connectors 236 adapted to engage corresponding midplane connectors within the storage enclosure 120 (see e.g., FIG. 4).

Figure 21:
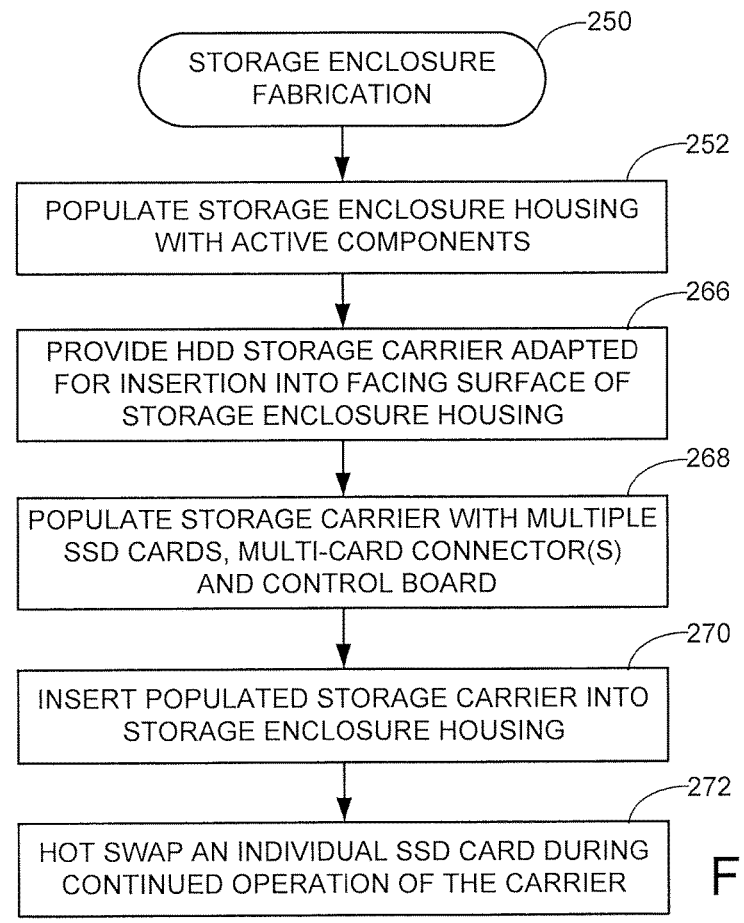
FIG. 21 is a flow chart for a storage enclosure fabrication routine to illustrate steps carried out in accordance with some embodiments.

FIG. 21 provides a flow chart for a storage enclosure fabrication routine 250 to summarize various steps in accordance with the foregoing discussion. FIG. 21 will be discussed in conjunction with FIG. 22, which provides a top plan view schematic representation of the storage enclosure 120 of FIG. 2 populated with carrier assemblies 254 nominally similar to the carrier assemblies 130, 160 and/or 220 discussed above. The flow chart of FIG. 21 and example configuration of FIG. 22 will be discussed using exemplary carriers sized to accommodate 2½ in form factor HDDs or 3½ in form factor HDDs and which are instead populated with M.2 sized SSD cards, but such is merely for purposes of illustration and not necessarily limiting.

Figure 22:
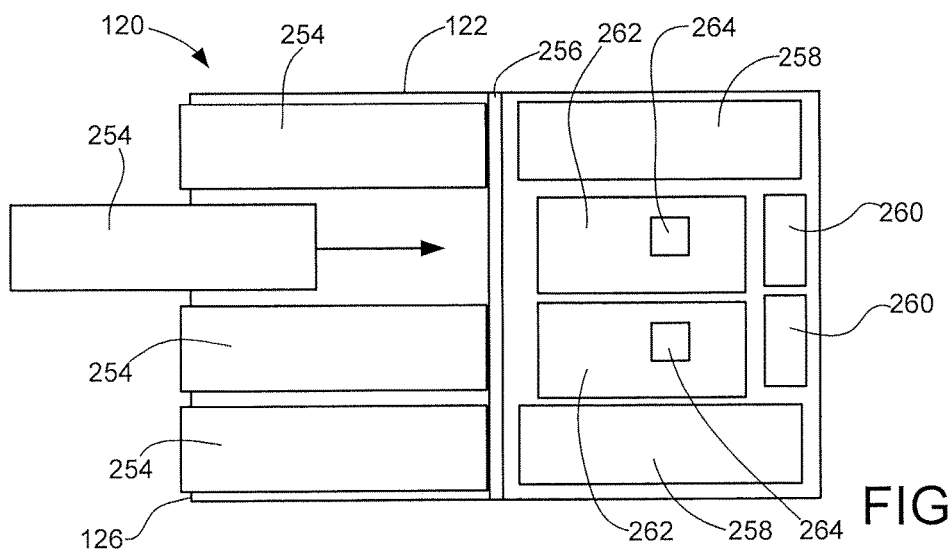
FIG. 22 is a top plan view of a storage enclosure to illustrate steps in FIG. 21.

With reference to FIGS. 21 and 22, the storage enclosure 120 is populated at step 252 with various components such as a midplane board 256, power supplies 258, fans 260, and controller boards 262 incorporating control circuitry 264 for the storage enclosure 120. The midplane board 256 extends across a medial portion of the storage enclosure 120 and includes connectors (138, FIG. 4) to facilitate electrical and mechanical interconnection of the respective carrier assemblies 254. Other interconnection configurations can be used, however, including those that do not employ a midplane board.

An HDD storage carrier 254 is provided at step 266 configured to support one or more HDDs. The storage carrier is adapted to be inserted through the front facing surface 126 of the storage enclosure housing 122. The storage carrier 254 is populated at step 268 with multiple SSD cards such as 132, 166, 230, at least one multi-card connector such as 134, 178, 226, and at least one control board such as 136, 172, 228. Exemplary internal configurations of these components are set forth above including in FIGS. 5, 12 and 19.

Once populated, the carrier assembly 254 is inserted into the storage enclosure housing at step 270. This may include mating insertion of one or more connectors coupled to the expander board to one or more connectors on the midplane 256. The storage enclosure is thereafter operated to support the transfer of data between various client devices (e.g., 112, FIG. 2) and the memory devices on the respective SSD cards 132, 166, 230.

At step 272, a selected, individual SSD card is hot swapped during continued operation of the storage carrier. This may be carried out by the user depressing a tactile switch on the front facing portion of the carrier to signify an intent to remove and replace the associated SSD card, followed by retraction of the associated SSD card (and the SSD carrier if used) through an access aperture extending through the front facing portion of the carrier. A new replacement SSD card (and SSD carrier if used) is thereafter inserted into the carrier along the same insertion path.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:
1. An apparatus comprising:
a carrier housing having length, width and thickness dimensions adapted to accommodate at least one hard disc drive (HDD) having a selected HDD form factor and configured for engagement in a storage enclosure housing;
a plurality of solid state drives (SSDs) each conforming to a selected SSD form factor supported within the length, width and thickness dimensions of the carrier housing and each individually retractable from a front facing portion of the carrier housing without removal of the carrier housing from the storage enclosure housing;

a carrier connector configured to mate with a storage enclosure connector of the storage enclosure housing; and a control board disposed within the carrier housing and connected to the plurality of SSDs, the control board comprising a switch circuit configured to multiplex electrical interconnection of each of the plurality of SSDs to the storage enclosure connector.

2. The apparatus of claim 1, wherein the selected HDD form factor is a 3½ inch form factor or a 2½ inch form factor and the selected SSD form factor is an M.2 form factor.

3. The apparatus of claim 1, further comprising a multi-card connector disposed within the carrier housing having a connector body with a plurality of slots to respectively accommodate contacting insertion of an edge connector of each of the SSDs along an insertion path parallel to a longest length dimension of the carrier housing.

4. The apparatus of claim 3, wherein the multi-card connector is a first connector that accommodates contacting insertion of a first portion of the plurality of SSDs and the apparatus further comprises a second multi-card connector nominally identical to the first connector that accommodates contacting insertion of a second portion of the plurality of SSDs.

5. The apparatus of claim 1, further comprising a corresponding plurality of SSD carriers each attached to a corresponding one of the plurality of SSDs, a distal end of each of the SSD carriers extending through the front facing portion of the carrier housing.

6. The apparatus of claim 1, further comprising a corresponding plurality of SSD carriers each attached to a corresponding one of the plurality of SSDs within the carrier housing, a distal end of each of the SSD carriers extending through an access aperture in the front facing portion of the carrier housing to facilitate removal and replacement of the associated SSD therethrough.

7. The apparatus of claim 1, wherein the plurality of SSDs are stacked in at least one axially aligned column within the carrier housing.

8. The apparatus of claim 1, further comprising a corresponding plurality of SSD connectors attached to a connector PCB, with each of the plurality of SSD connectors contactingly engaging a respective one of the SSDs.

9. The apparatus of claim 1, wherein the plurality of SSDs are stacked in multiple adjacent axially aligned columns and are each individually plugged into a corresponding slot of a multi-card connector, the control board spanning the multiple adjacent axially aligned columns and having an edge connector that plugs into the multi-card connector.

10. The apparatus of claim 1, further comprising a user interface mounted to the carrier housing having a user depressible switch associated with at least one of the SSDs configured to facilitate a hot swap operation during which the at least one of the SSDs is removed and replaced with a replacement SSD while the carrier assembly remains installed in an operational state within the storage enclosure.

11. A storage enclosure comprising:

a storage enclosure housing having overall length and width dimensions, a front facing surface and a rear facing surface;

at least a selected one of a storage enclosure control board supporting a control circuit, a power supply, or a cooling fan mounted within the storage enclosure housing adjacent the rear facing surface;

a plurality of storage enclosure connectors mounted within the storage enclosure housing at a medial location thereof; and a plurality of carrier assemblies disposed within the storage enclosure housing adjacent to and extending through the front facing surface, each of the carrier assemblies comprising a carrier housing sized to accommodate at least one storage device having a 3½ in form factor or a 2½ in form factor, a plurality of solid state drive (SSD) cards each conforming to a selected M.2 SSD form factor, a multi-card connector which receivingly engages the SSD cards and a carrier control board supporting a switching circuit connected to the multi-card connector and a selected one of the storage enclosure connectors, each of the SSD cards individually removable and replaceable through an access aperture in a front facing surface of the carrier housing without removal of the carrier housing from the storage enclosure housing.

12. The storage enclosure of claim 11, wherein the plurality of SSDs in each carrier assembly comprises at least twelve (12) SSD cards each having a nominal width of 22 millimeters, mm in conformance with the selected form factor of the M.2 standard.

13. The storage enclosure of claim 11, wherein the multi-card connector has a connector body with a plurality of slots to respectively accommodate contacting insertion of an edge connector of each of the SSDs along an insertion path through the access aperture in the front facing surface of the carrier housing and parallel to a longest length dimension of the carrier housing.

14. The storage enclosure of claim 11, wherein each carrier assembly further comprises a corresponding plurality of SSD carriers each attached to a corresponding one of the plurality of SSD cards within the associated carrier assembly, a distal end of each of the SSD carriers extending through the access aperture in the front facing portion of the carrier housing to facilitate removal and replacement of the associated SSD card therethrough.

15. The storage enclosure of claim 11, wherein the plurality of storage enclosure connectors are mounted to a midplane board that transverses the storage enclosure housing in a direction nominally parallel to the front facing surface of the storage enclosure housing.

16. The storage enclosure of claim 11, wherein the plurality of SSD cards is stacked in a single axially aligned column within the carrier housing.

17. The storage enclosure of claim 11, wherein the plurality of SSDs are stacked in multiple adjacent axially aligned columns within the carrier housing.

18. The storage enclosure of claim 11, further comprising a user interface mounted to the carrier housing having a user depressible switch associated with at least one of the SSDs configured to facilitate a hot swap operation during which the at least one of the SSDs is removed and replaced with a replacement SSD while the carrier assembly remains installed in an operational state within the storage enclosure.

19. A method comprising:

populating a storage enclosure housing with a storage enclosure control board supporting a control circuit, a power supply, and a cooling fan adjacent a rear facing surface of the storage enclosure housing, and a plurality of storage enclosure connectors adjacent a medial location of the storage enclosure housing;

placing a plurality of solid state drive (SSD) cards conforming to a selected M.2 SSD form factor standard into a carrier assembly housing sized to accommodate at least one storage device having a 3½ in form factor or a 2½ in form factor, the plurality of SSD cards contactingly engaging a multi-card connector within the carrier assembly housing along a zero degree insertion path orthogonal to a front facing surface of the carrier assembly housing; and inserting the carrier assembly housing into the storage enclosure housing through a front facing surface of the storage enclosure housing to engage a carrier connector in communication with the multi-card connector with a selected one of the plurality of storage enclosure connectors.

20. The method of claim 19, further comprising performing a hot swap operation upon a selected one of the plurality of SSD cards by retracting the selected one of the plurality of SSD cards through an access aperture extending through the front facing surface of the carrier assembly housing and replacing with a replacement SSD card which is inserted through the access aperture and into the multi-card connector while the carrier assembly housing remains disposed within the storage enclosure housing.

\* \* \* \* \*